(12) United States Patent
Lam et al.

(10) Patent No.: US 7,179,346 B2
(45) Date of Patent: Feb. 20, 2007

(54) SEMICONDUCTOR APPARATUS WITH MULTIPLE DELIVERY DEVICES FOR COMPONENTS

(75) Inventors: Kui Kam Lam, Kwai Chung (CN); Man Chung Raymond Ng, Kwai Chung (CN); Yen Hsi Terry Tang, Kwai Chung (CN)

(73) Assignee: ASM Assembly Automation Ltd., Hong Kong (HK)

( * ) Notice: Subject to any disclaimer, the term of this patent is extended or adjusted under 35 U.S.C. 154(b) by 0 days.

(21) Appl. No.: 10/454,259

(22) Filed: Jun. 3, 2003

(65) Prior Publication Data

US 2004/0244915 A1 Dec. 9, 2004

(51) Int. Cl.
*B32B 37/00* (2006.01)
*H01L 21/52* (2006.01)

(52) U.S. Cl. .................. 156/299; 156/64; 156/249; 156/302; 156/351; 156/378; 156/541; 156/560; 156/569; 414/751.1; 414/798.3; 414/798.9; 901/30; 700/248; 700/121; 700/249; 700/259

(58) Field of Classification Search .................. 156/64, 156/249, 299, 351, 358, 541, 560, 569, 570, 156/571, 572, 302, 378, 265, 512, 563, 517, 156/558; 414/749.1, 751.1, 752.1, 753.1, 414/788.1, 788.4, 795.7, 796.9, 797, 797.1, 414/799, 798.9, 798.3; 29/426.3, 740, 742, 29/743; 901/30, 31, 8; 700/248, 121, 249, 700/259, 302
See application file for complete search history.

(56) References Cited

U.S. PATENT DOCUMENTS

| | | | | | |
|---|---|---|---|---|---|
| 3,616,948 | A | * | 11/1971 | Imhof et al. ............. | 414/788.4 |
| 3,921,821 | A | * | 11/1975 | Champion et al. ....... | 73/864.33 |
| 4,824,633 | A | * | 4/1989 | Ichikawa et al. ........... | 376/268 |
| 4,890,241 | A | * | 12/1989 | Hoffman et al. ............ | 700/255 |
| 6,248,201 | B1 | * | 6/2001 | Boyd et al. .................. | 156/247 |
| 6,658,324 | B2 | * | 12/2003 | Bancroft et al. ............ | 700/245 |
| 6,742,561 | B2 | * | 6/2004 | Nam et al. .................. | 156/521 |

FOREIGN PATENT DOCUMENTS

JP 2003-007731 1/2003

* cited by examiner

*Primary Examiner*—Linda Gray
(74) *Attorney, Agent, or Firm*—Ostrolenk, Faber, Gerb & Soffen, LLP

(57) ABSTRACT

An apparatus is provided for transferring components from a pick-up position amongst a supply of components to a placement position on a receptor, such as a die pad, during semiconductor processing. It includes a first delivery device and a second delivery device operative to alternatively transfer the components from the pick-up position to the placement position. The second delivery device is arranged opposite the first delivery device about a line passing through the pick-up position and the placement position.

17 Claims, 7 Drawing Sheets

SEMICONDUCTOR APPARATUS WITH MULTIPLE DELIVERY DEVICES FOR COMPONENTS

FIELD OF THE INVENTION

The present invention relates to an apparatus for delivering components or materials such as semiconductor dice or epoxy onto substrates during semiconductor processing, and in particular, to an apparatus with a plurality of delivery devices to execute such operations.

BACKGROUND AND PRIOR ART

Pick-and-place machines are commonly used in automated semiconductor equipment to accurately deliver components or materials onto semiconductor substrates, such as leadframes. An example is the die bonding machine, which transfers cut wafer dice or chips from a wafer table onto a substrate in a "pick-and-place" operation. For operational simplicity, single bond head systems are normally used to perform the pick-and-place operation. However, there is a limitation in the throughput (normally quantified in Units Per Hour or "UPH") attainable for single-head systems. Present systems with single bond heads cannot sufficiently fulfill the increasing demand for high throughput, and therefore there is a desire to develop systems with multiple bond heads that can perform die-bonding simultaneously.

In U.S. Pat. No. 5,397,423 for "Multi-head Die Bonding System", multiple bond heads are spaced apart and mounted on a single conveyor mechanism. The bond heads pick up semiconductor dice from a wafer table and bond the dice to a substrate at a separate station. Although throughput from such a multi-head system is higher than for single-head systems, the arrangement of heads in this design is constrained by the configuration of the substrate. This system is not sufficiently flexible. The space available to accommodate the multiple bond heads and conveyor system is another problem.

There are mainly two other types of prior art multiple bond-head systems. They are cascade line systems as shown in FIG. 1 and multiple bond-arm systems as shown in FIG. 2. The bonding methods and apparatus for such systems will be described below.

As shown in FIG. 1, a cascade line system is constructed by linking two individual bonding machines 101, 102 for bonding dice to substrates 103 at a pair of bonding locations 104, 105. The minimal configuration of this system should include at least two die delivery devices 106, 107, two die supplying devices 108, 109, two pick optical systems and two bond optical systems (not shown). Die delivery devices 106, 107 pick up dice from their corresponding wafer table 108, 109 and transfer them to the bonding locations 104, 105 of the substrate 103 where the dice are bonded. A substrate conveying device 110 is provided to act as a connection between the two bonding machines 101, 102, for conveying substrates from an offload section of one machine 101 to the onload section of the other machine 102.

For cascade line systems as shown in FIG. 1, a malfunction of an individual machine 101, 102 will affect the overall machine performance. Moreover, since the machine is more complex with a higher number of devices, there is a higher possibility of failure.

As shown in FIGS. 2a and 2b, a multiple bond-arm system comprises a substrate conveying device 201, two die supplying devices 202, two pick optical systems (not shown), one bond optical system (not shown), a die delivery device 203 and two bond arms 204. The bond arms 204 can be mounted either in a pair on a linear carriage as shown in FIG. 2a or in a V-shaped layout on a rotary platform as shown in FIG. 2b. For both system configurations, the two die supplying devices 202 are mounted on opposite sides of a substrate-conveying device 201. The relative positions of the bond arms 204 are arranged such that the pick-and-place motions can be performed simultaneously by using a common die delivery device 203.

For systems with multiple bond arms, in which each bond arm carries a bond head that is mounted on a single die delivery device either on a linear arm or on rotary V-shaped arms as shown in FIG. 2a and FIG. 2b, the bond heads are coupled together so that their positions are mutually dependent. The simultaneous pick-and-place motion is only possible when locations of both bond heads are precisely aligned with the pick and bond points. If there is an error in aligning the positions as well as the level adjustments for each individual bond head during machine operation, the die delivery device 203 will be unable to make any compensation for the positional error of the individual bond heads as well as for dimensional deviations among the die and substrate.

Further, large footprints are required for both the cascade line and multi-arm systems since more space is required to accommodate the duplicated devices in the form of extra wafer tables and optical tables. A high apparatus cost for both cascade line and multi-head systems is thereby incurred.

SUMMARY OF THE INVENTION

The invention thus seeks to provide an improved apparatus with increased throughput by utilizing multiple delivery devices to delivery materials onto a substrate without some of the aforesaid disadvantages.

Accordingly, the invention provides an apparatus for transferring components from a pick-up position amongst a supply of components to a placement position on a receptor during semiconductor processing, comprising: a first delivery device and a second delivery device arranged opposite the first delivery device about a line passing through the pick-up position and the placement position, wherein the first and second delivery devices are operative to alternately transfer the components from the pick-up position to the placement position.

It would be convenient hereinafter to describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

An example of an apparatus in accordance with the invention will now be described with reference to the accompanying drawings, in which.

DETAILED DESCRIPTION OF THE PREFERRED EMBODIMENT

An embodiment of the present invention will now be described with reference to FIGS. 3–7.

Figure 1:
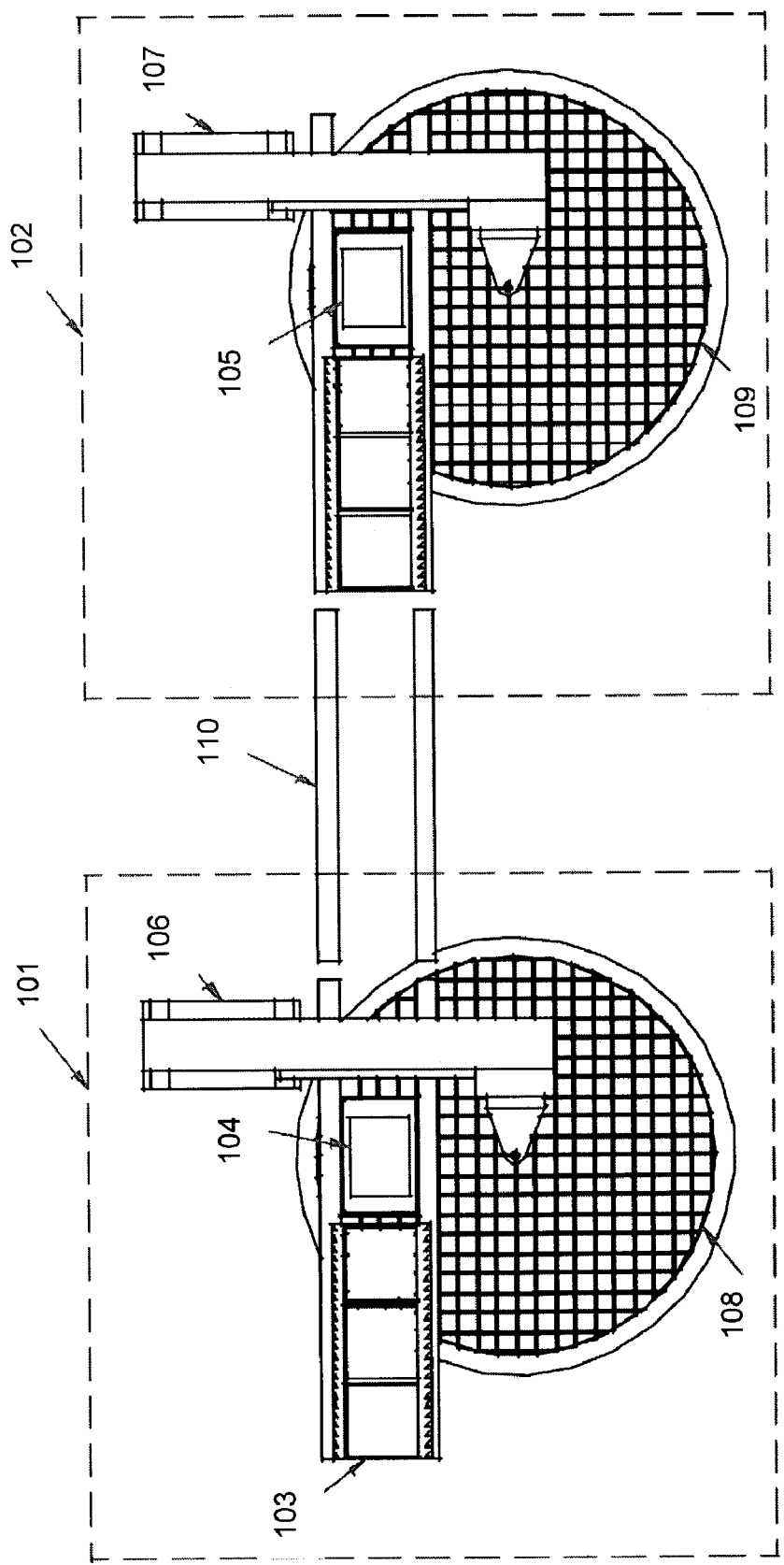
FIG. 1 is a plan view of a conventional cascade line for a dual bond head die bonding system.
Figure 2A:
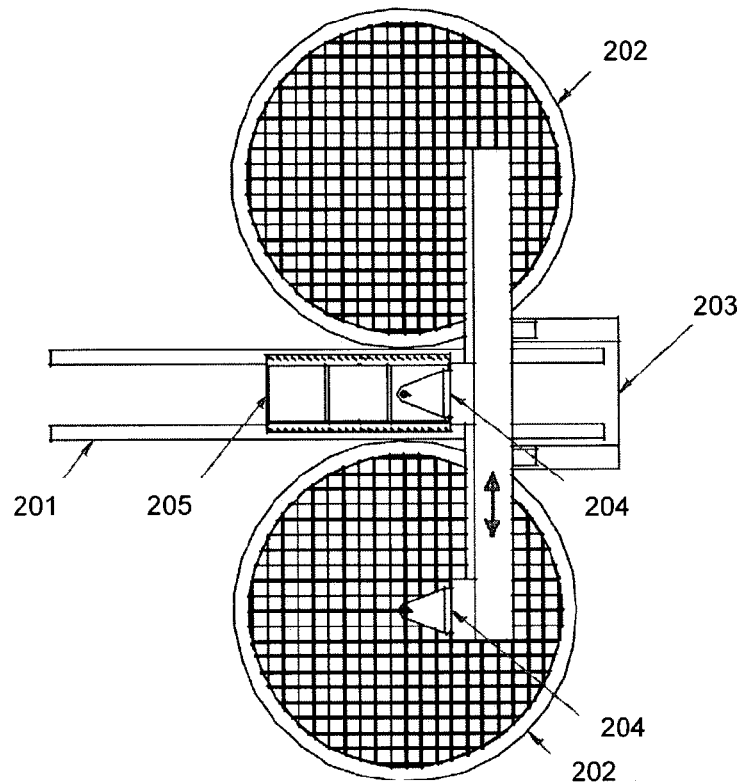
FIGS. 2a and 2b are plan views of multiple bond-arm systems with a linear arm and a rotary V-arm configuration respectively.
Figure 2B:
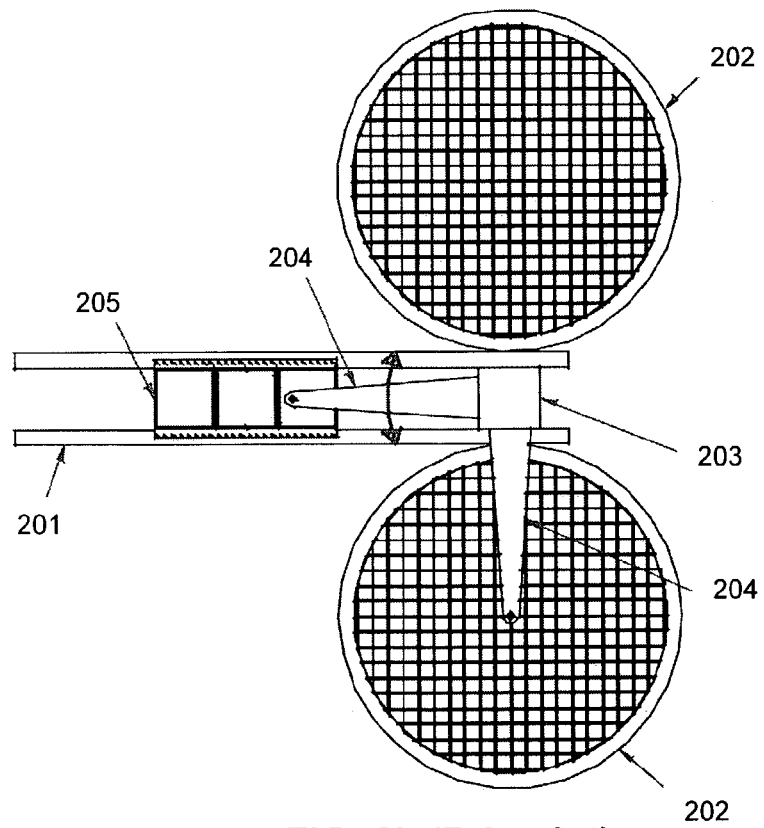
Figure 3:
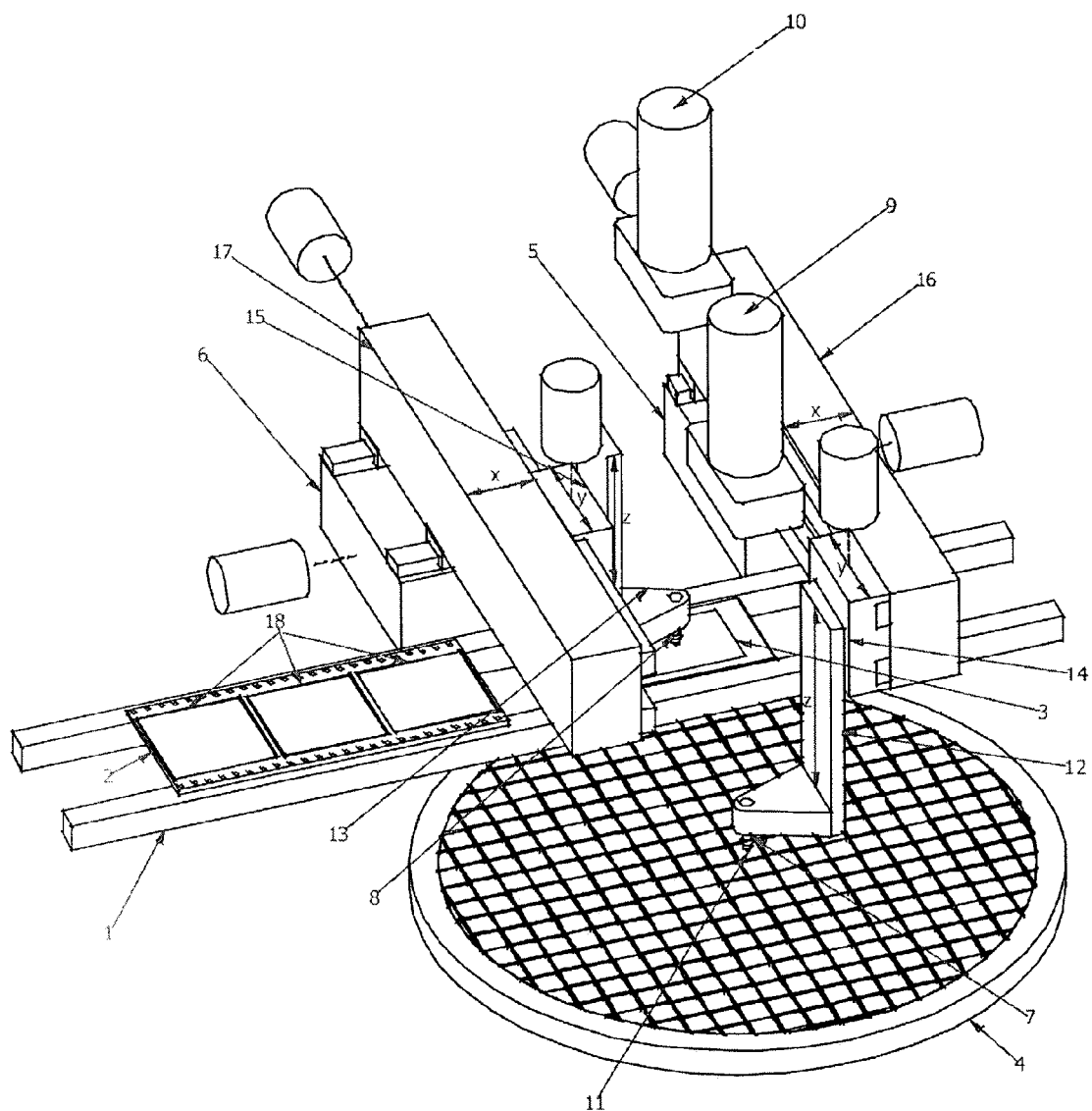
FIG. 3 is a perspective view of an apparatus according to the preferred embodiment of the invention in the form of a multiple bond head bonding system.

FIG. 3 is a perspective view of an apparatus according to the preferred embodiment of the invention in the form of a multiple bond head bonding system. The apparatus comprises as its major components a substrate conveying device 1 for conveying substrates 2 uni-directionally to a placement position or bonding region 3 wherein a receptor surface 18 is provided for bonding the substrate 2. It also comprises a supply of components by way of a die supplying device 4 in the form of a wafer table, first and second die delivery devices 5, 6 wherein each die delivery device 5, 6 carries a die holding tool 7, 8.

The apparatus transfers the die components from a pick-up position or pick point 11 amongst the supply of components 4 to the placement position or bonding region 3. The second die delivery device 6 is arranged opposite the first die delivery device 5 about a line passing through the pick point 11 and the bonding region 3. In use, the two delivery devices 5, 6 will generally be moving on opposite sides of the said line, except during pick-up and placement, when their respective die handling tools 7, 8 will generally be positioned along the line.

There are driving means capable of operating the die delivery devices 5, 6 independently. The driving means may include X carriages 16, 17 to position the die holding tools 7, 8 in the X-axis, Y carriages 14, 15 to position the tools 7, 8 in the Y-axis and Z carriages 12, 13 to position the tools 7, 8 in the Z-axis. Therefore, the die delivery devices 5, 6 are drivable along the orthogonal x-, y- and z-axes. The pick point 11 is preferably in a fixed position, such that the die holding tools 7, 8 are programmed to pick the dice from the die supplying device 4 at the pick point 11. The delivery devices 5, 6 are programmed to alternately transfer the die components from the pick point 11 to bonding region 3, as described in greater detail below. There is also a pick-up optical device 9 over the pick-up position 11 and a placement optical device 10 over the placement position 3.

A substrate 2 is delivered from a substrate-supplying unit (not shown) to the substrate conveying device 1. Prior to die-bonding, the substrate 2 is usually pretreated. In an epoxy die bonder, this may involve dispensing an adhesive material onto receptors or bond pads 18 of the substrate 2. In the case of an eutectic die bonder, a heating capsule may deliver thermal energy to the bond pads 18 instead. The pretreated substrate 2 is advanced stepwise by the conveying device 1 to the bonding region 3 where it is ready for semiconductor dice to be bonded to it.

Figure 4A:
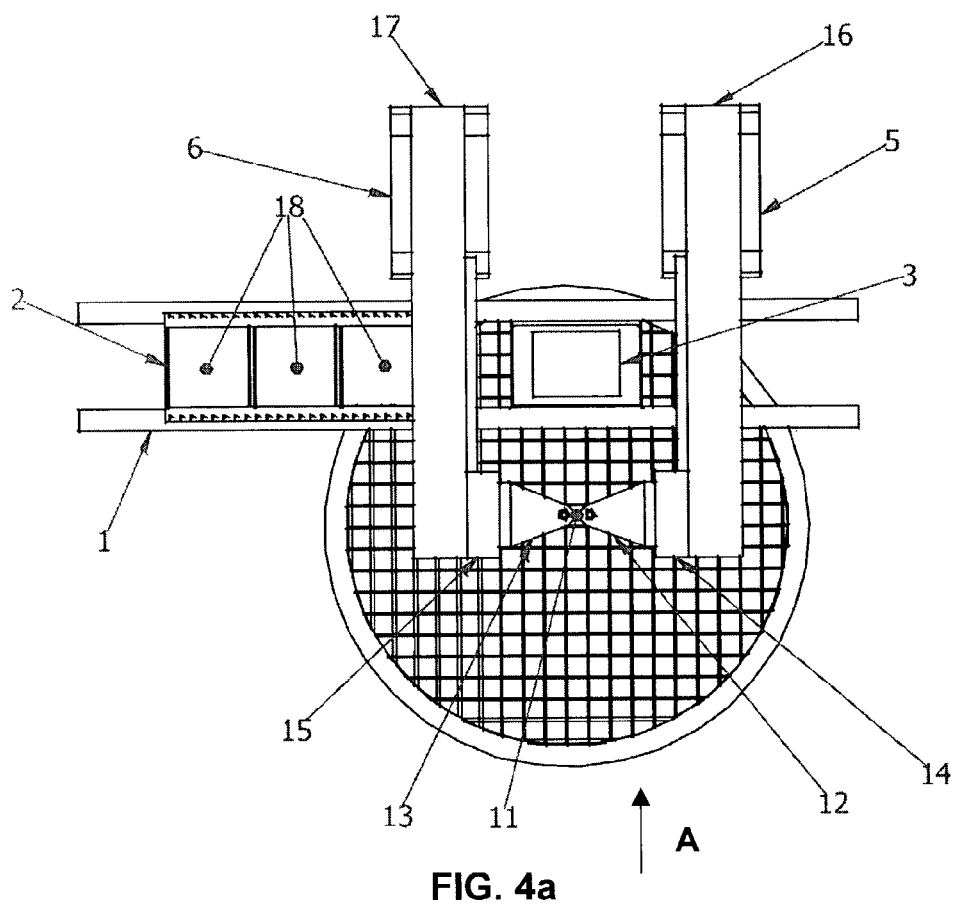
FIGS. 4a and 4b are plan and front views respectively of the bonding system of FIG. 3 wherein both die delivery devices are at their home positions.
Figure 4B:
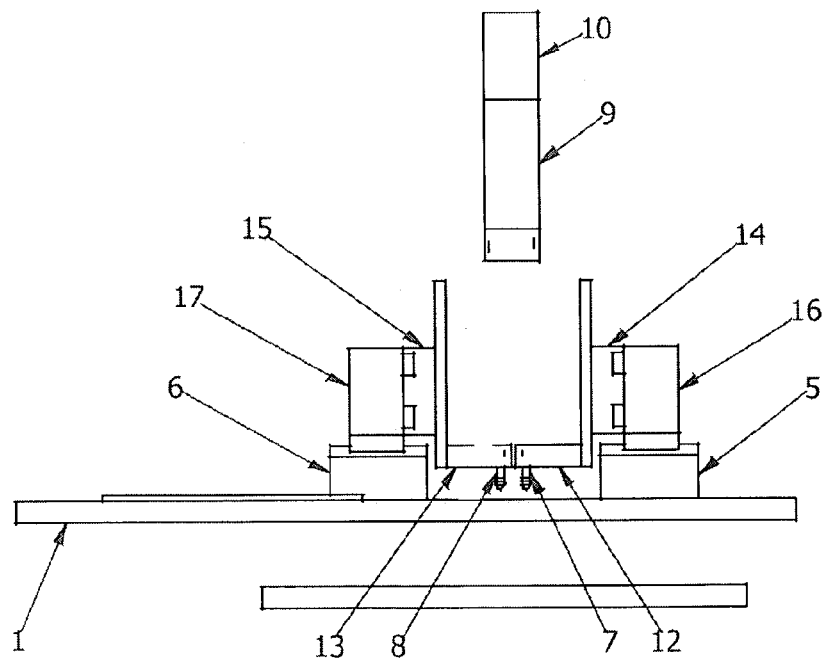

FIGS. 4a and 4b are plan and front views respectively of the bonding system of FIG. 3 wherein both die delivery devices 5, 6 are at their home positions, which is a first stationary position before operation. FIG. 4b is the view from direction A of FIG. 4a. The X carriages 16, 17 of the die delivery devices 5, 6 are at farthermost positions away from each other, the Y carriages 14, 15 are at their front-most positions near to the die supplying device 4, and the Z carriages 12, 13 are at their topmost positions.

One example of a motion sequence for the die delivery devices 5, 6 to arrive at the home positions is to drive the two X carriages 16, 17 moving away from each other first, followed by driving the Y carriages 14, 15 and Z carriages 12, 13, either sequentially or at the same time. The configurations of the die delivery devices 5, 6 are similar except that the corresponding Z carriages 12, 13 for mounting the die delivery devices 5, 6 are placed facing toward each other.

The die delivery devices 5, 6 include compound tables wherein the X carriages 16, 17, the Y carriages 14, 15 and the Z carriages 12, 13 are driven by associated actuators to move the die holding tools 7, 8 of the die delivery devices 5, 6 in the X-, Y- and Z-axes. Preferably, the drivers in the Y- and Z-axes are decoupled. Both die delivery devices 5, 6 are equipped with positional sensors so that the positions of the die delivery devices 5, 6 may be continually monitored in order to prevent them from colliding with each other.

Figure 5A:
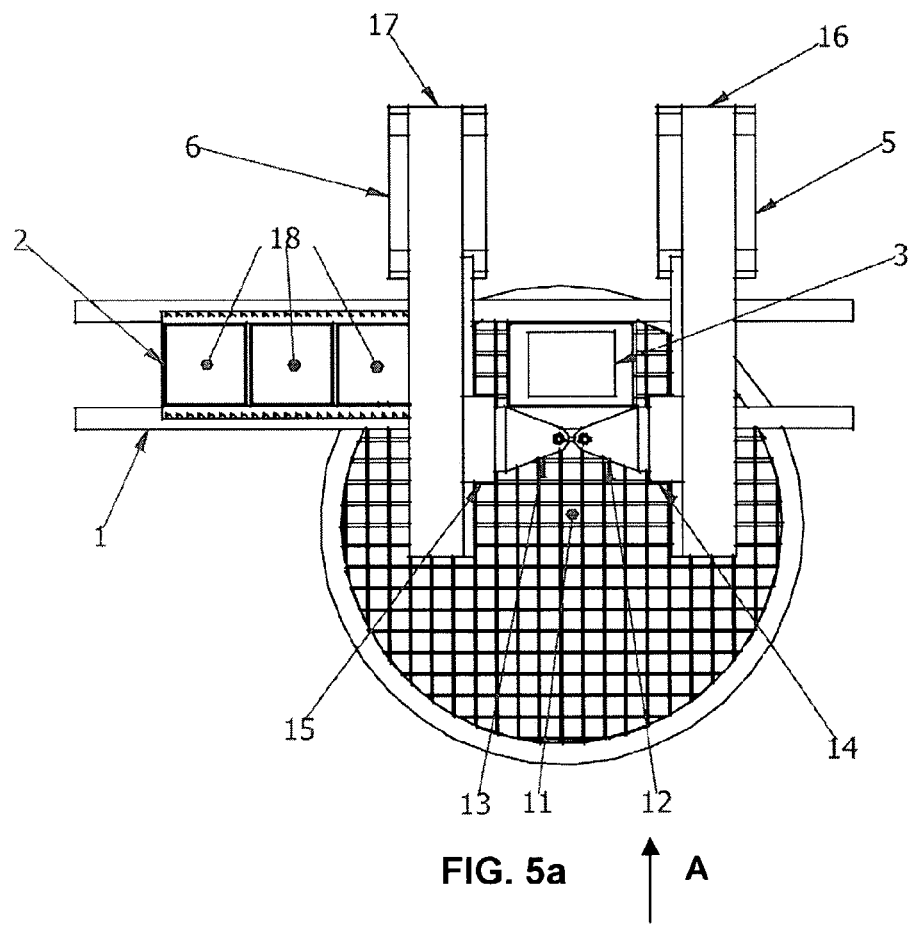
FIGS. 5a and 5b are plan and front views respectively of the bonding system of FIG. 3 wherein both die delivery devices are at their standby positions.
Figure 5B:
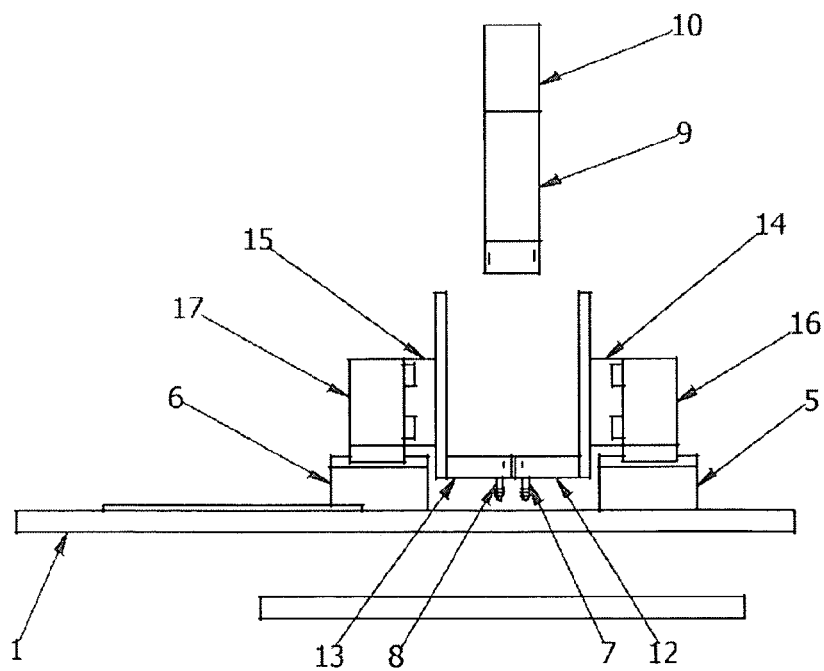

FIGS. 5a and 5b are plan and front views respectively of the bonding system of FIG. 3 wherein both die delivery devices 5, 6 are at their standby positions, which is a second stationary position before operation. FIG. 5b is the view from direction A of FIG. 5a. This position is where the die holding tool 7 is ready to pick up a die. A die is moved to the pick point 11 by the die supplying device 4. Simultaneously, a substrate 2 on the substrate conveying device 1 is fed to the bonding station and stopped at the bonding region 3 by the substrate conveying device 1. It would be appreciated that at least in the two stationary positions shown in FIGS. 4 and 5, the die delivery devices 5, 6 are arranged symmetrically about the line passing through the pick point 11 and bonding region 3. At these stationary positions, the Z carriages 12, 13 are also mounted facing each other.

Figure 6A:
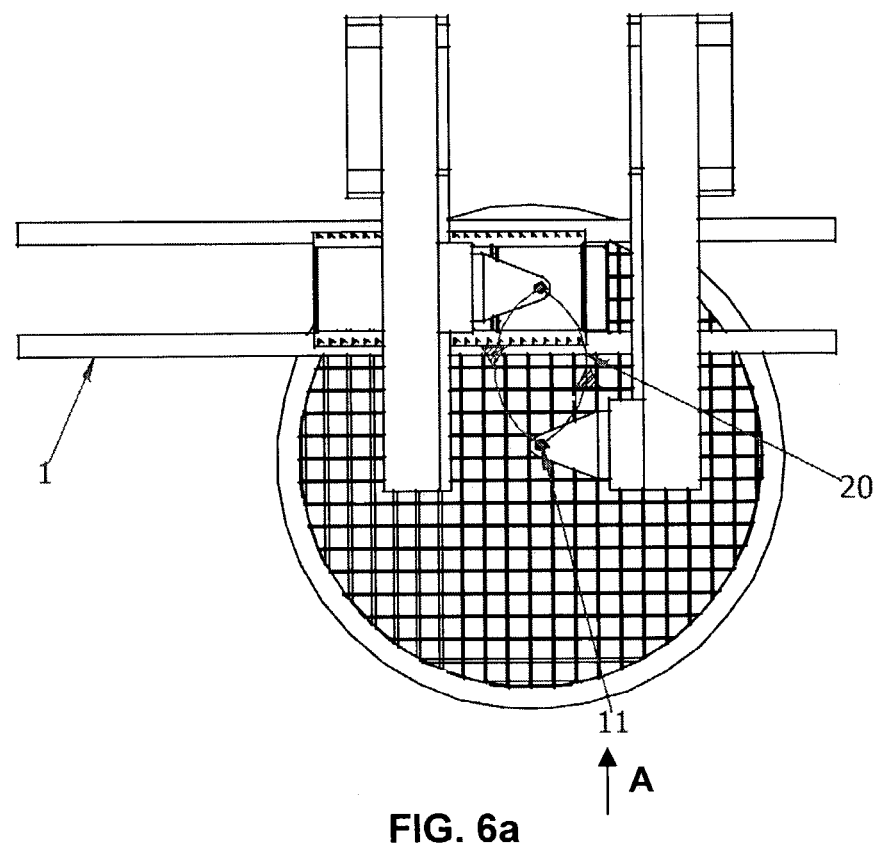
FIGS. 6a and 6b are plan and front views respectively of the bonding system of FIG. 3 showing the feed paths of the die holding tools of the die delivery devices.
Figure 6B:
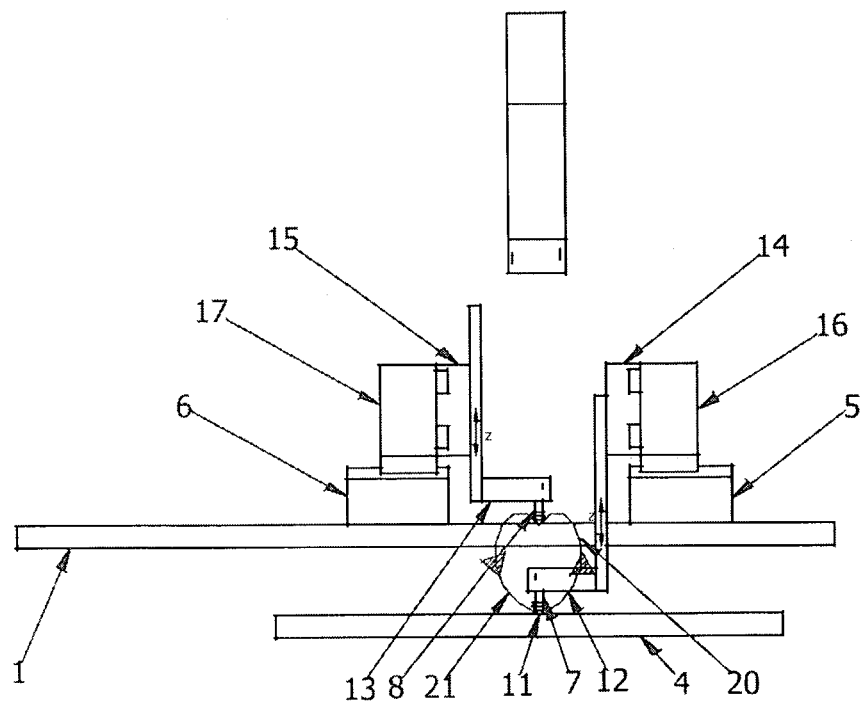

FIGS. 6a and 6b are plan and front views respectively of the bonding system of FIG. 3 showing the travel paths comprising feed paths 20, 21 of the die holding tools 7, 8 of the die delivery devices 5, 6. FIG. 6b is the view from direction A of FIG. 6a. A bonding cycle of the system begins with the die holding tool 7 moving to a position above pick point 11 as shown in FIG. 6. Vacuum is applied in the die holding tool 7 as it is lowered onto a die at the pick point 11, which is then lifted. As the dice on the die supplying device 4 are usually mounted on an adhesive tape to maintain their configuration, the lifting of the die holding tool 7 is synchronized with an upward motion of an ejector pin (not shown) in the die supplying device 4 against the die, such that the simultaneous actions lift the die until the die is completely peeled off from its tape backing. The ejector pin then retracts and the die is held by the die holding tool 7.

Once the die holding tool 7 holds the die, it moves along a path 20 from pick point 11 to a point above the bonding region 3. The die holding tool 7 is lowered onto the bond pad 18 in the bonding region 3 whereat the vacuum in the die holding tool 7 is switched off and the die is bonded onto the receptor or bond pad 18 of the substrate 2. At the same time, the other die holding tool 8 moves along a path 21 to pick point 11 wherein another die provided by the die supplying device 4 is picked and moved along travel path 23 shown in FIG. 7. Both feed paths 20, 21 of the die holding tools 7, 8 can be driven by the corresponding die delivery devices 5, 6 in any combination of motion trajectories in the X-, Y- and Z-planes.

Figure 7A:
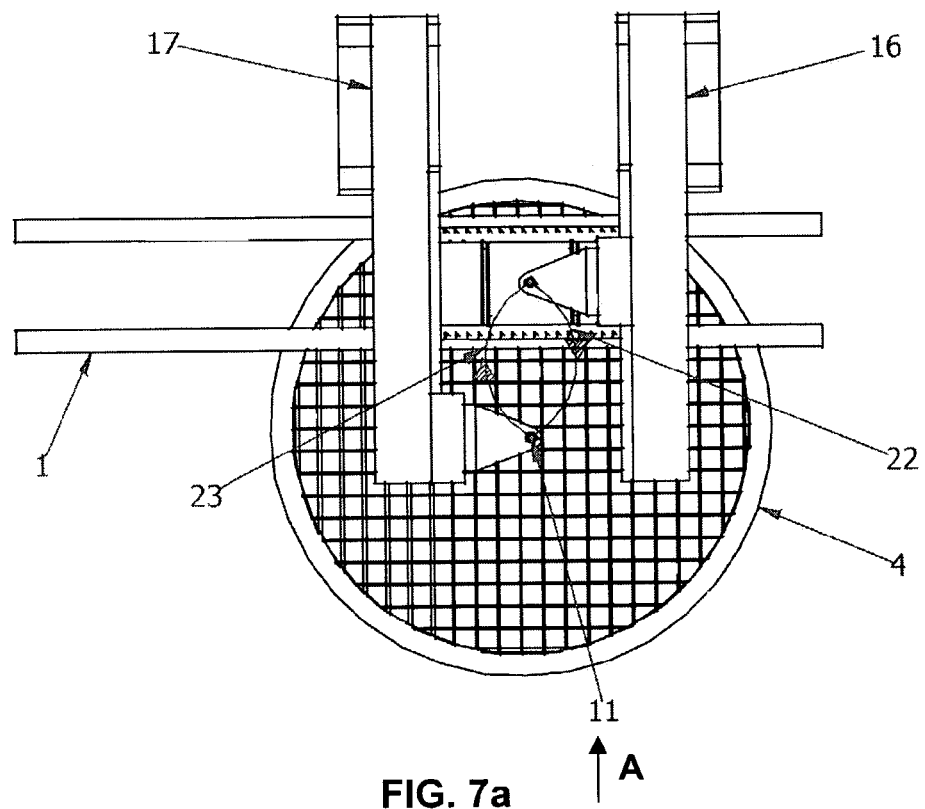
FIGS. 7a and 7b are plan and front views respectively of the bonding system of FIG. 3 showing the return paths of the die holding tools of the die delivery devices.
Figure 7B:
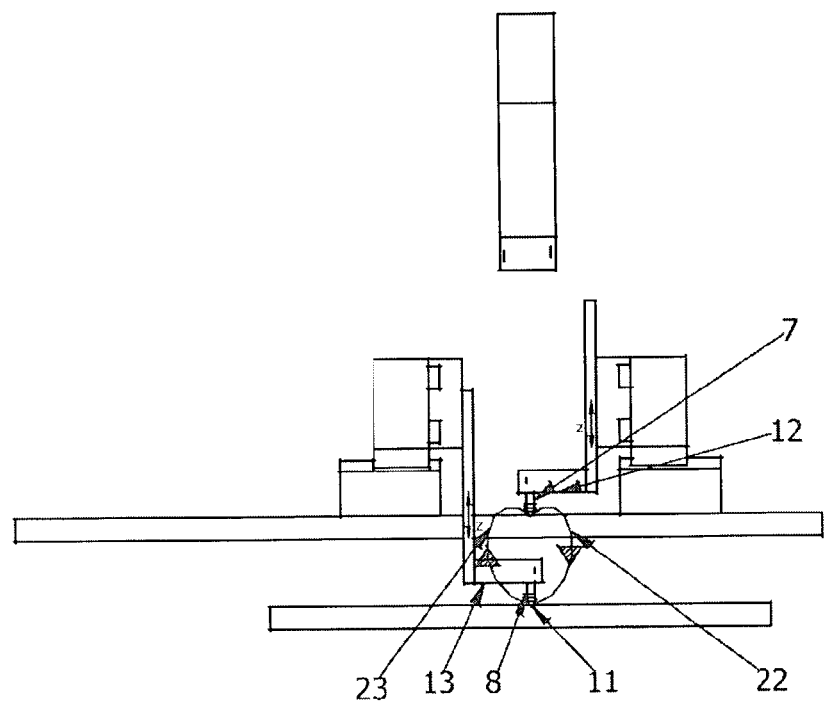

FIGS. 7a and 7b are plan and front views respectively of the bonding system of FIG. 3 showing the travel paths comprising return paths 22, 23 of the die holding tools 7, 8 of the die delivery devices 5, 6. FIG. 7b is the view from direction A of FIG. 7a. After the die holding tool 7 bonds a die to the bond pad 18 of the substrate 2, it moves along a path 22 from bonding region 3 to pick point 11 where it picks another die provided by the die supplying device 4. At the same time, after the die holding tool 8 picks up a die from the die supplying device 4, it moves along path 23 from pick point 11 to bonding region 3 wherein it bonds the die to an unoccupied receptor or bond pad 18 in the bonding region 3. Both paths 22, 23 of the die holding tools 7, 8 can be driven by the die delivery devices 5, 6 in any combination of motion trajectories in the X-, Y- and Z-planes. Moreover, the travel paths 20, 21, 22 and 23 are not necessarily identical. This bonding cycle is repeated until all bond pads 18 on the substrate 2 are bonded. The substrate conveying device moves the substrate 2 to an unloading section (not shown) of the substrate conveying device 1. A new substrate is fed to bonding region 3 and the bonding cycle is repeated.

It would be noticed from the above that the die delivery devices 5, 6 are drivable to simultaneously move in substantially opposite directions between the pick-up position 11 and the placement position 3. Furthermore, the first die delivery device 5 or second die delivery device 6 is operative to pick up a die from the pick-up position 11 substantially simultaneously with the other delivery device placing a die at the placement position 3. By doing so, UPH is increased because pick-up and placement can be performed simultaneously. In the described embodiment, it would also be appreciated that the travel paths 20, 22 of the first die delivery device 5 mirror the travel paths 21, 23 of the second die delivery device 6 about the line passing through the pick-up position 11 and the placement position 3.

Before each die is bonded, the bond pad position 18 of a substrate 2 to which the die is to be bonded is checked by the placement optical device 10 which is mounted above the placement position or bonding region 3. The bonding region 3 is a region on the bonding surface where die holding tools 7, 8 are operative to bond the dice. Any positional offsets between the position of bond pad 18 and the bonding region 3 may be compensated for by adjusting the die delivery device 5, 6 which is ready to perform bonding during a bonding cycle. According to the feedback values of the positional offsets, the die delivery device 5, 6 will drive the die holding tool 7, 8 to the actual bond pad position. Similarly, before each die is picked, its position is checked by a pick-up optical device 9 which is mounted above the pick point 11. Any positional offset between the die position and the pick point 11 may be compensated for by the die delivery device 5, 6 which is ready to pick a die during a bonding cycle whilst any rotational offset may be compensated for by rotating the die supplying device 4.

In the present embodiment, the apparatus is described for a die bonding application. However, it is also applicable for instance as an epoxy stamping system by replacing the die supplying device 4 and die holding tools 7, 8 with an epoxy supply device and stamping pins as the components to be transferred and the delivery devices respectively. Other applications that fall within the scope of the claims are also possible. Furthermore, in the above embodiment, the die delivery devices 5, 6 alternatively bond dice to successive bond pads 18. However, successive dice can be bonded to sub-units on the same bond pad 18 as long as the sub-units are in the bonding region 3.

In the above embodiment, each die delivery device 5, 6 includes a compound table that is constructed by an X carriage 16, 17, Y carriage 14, 15 and Z carriage 12, 13. The arrangement of these carriages can be either coupled or decoupled.

Furthermore, in the above embodiment, each die delivery device 5, 6 has its own base support where the guides for the X carriages 16, 17 are mounted. However, the two die delivery devices 5, 6 can be mounted on a common base support.

It would be appreciated that since two individual die delivery devices 5, 6 alternately pick up the dice from the same point 11 of a common die supplying station 1 or wafer table and deliver the dice to a region where the die is bonded onto a predetermined location of the substrate, it is not necessary to accommodate an extra die supplying station, die ejector station and pick optical station. Therefore, equipment duplication can be avoided.

The footprint of the new system is also reduced since both bond heads of the present invention pick up dice from a common wafer on the die supplying device 4, and no additional wafer table and pick optical system is required. The above embodiment of the invention is compact in size and low-cost when compared to the cascade line system as well as the conventional multiple bond head system. Amongst other things, this is because many hardware components, both mechanical and electrical, are duplicated or redundant in the prior art systems.

Unlike conventional multi-head systems wherein the pick heads and bond heads are coupled, throughput of the present invention system may be substantially increased due to parallel functioning of the independent bond heads, comprising the die delivery devices 5, 6 and the die holding tools 7, 8. Malfunction of a bond head can also be bypassed such that the new system can still run production with only one bond head. Machine down time may thus be reduced.

The invention described herein is susceptible to variations, modifications and/or additions other than those specifically described and it is to be understood that the invention includes all such variations, modifications and/or additions which fall within the spirit and scope of the above description.

The invention claimed is:

1. An apparatus for transferring components from a pick-up position amongst a supply of components to a plurality of receptors at a same bonding region on an electronic device during semiconductor processing, comprising:
    first and second delivery devices operative to alternately transfer the components from the pick-up position to the plurality of receptors on the same bonding region of the electronic device, the first and second delivery devices being mounted on opposite sides of a line passing through the pick-up position and the same bonding region; and
    a driving arrangement for operating the first and second delivery devices independently along variable travel paths, wherein the first and second delivery devices each operate along at least two different paths.

2. An apparatus according to claim 1, wherein the delivery devices are drivable to simultaneously move in substantially opposite directions between the pick-up position and a placement position when in operation.

3. An apparatus according to claim 1, wherein the driving arrangement is adapted to drive the delivery devices along orthogonal x-, y- and z-axes.

4. An apparatus according to claim 3, wherein the driving arrangement includes first and second driving arrangements adapted to drive the delivery devices along the x- and y-axes, respectively, the first and second driving arrangements being decoupled from one another.

5. An apparatus according to claim 1, wherein the delivery devices are arranged symmetrically about the line passing through the pick-up position and the same bonding region at least when the delivery devices are at a stationary position.

6. An apparatus according to claim 1, wherein the driving arrangement includes respective Z carriages assigned to the delivery devices and operable to respectively drive the delivery devices along the z-axis, the Z carriages being mounted facing each other at a stationary position.

7. An apparatus according to claim 1, wherein each of the delivery devices is operative to pick up a component from the pick-up position at approximately the same time that the other delivery device places a component at the same bonding region.

8. An apparatus according to claim 1, wherein the pick-up position of the apparatus is fixed.

9. An apparatus according to claim 1, wherein the respective delivery devices are movable along pre-determined travel paths which mirror each other about the line passing through the pick-up position and the same bonding region.

10. An apparatus according to claim 1, further comprising a pick-up optical device arranged over the pick-up position and a placement optical device arranged over the same bonding region.

11. An apparatus according to claim 1, further comprising position sensors for continually monitoring positions of the delivery devices.

12. An apparatus according to claim 1, further comprising a placement optical device for measuring at least one of a positional offset and a rotational offset between a receptor and the pick-up position, so that the positional and rotational offsets between the receptor and pick-up position may be compensated for.

13. An apparatus according to claim 12, wherein the positional and rotational offsets are compensated for by adjusting the delivery devices.

14. An apparatus according to claim 12, wherein the rotational offset is compensated for by rotating the supply of components.

15. An apparatus according to claim 1, wherein the components comprise semiconductor dice and the delivery devices comprise respective die bond heads.

16. An apparatus according to claim 1, wherein the components comprise a supply of epoxy and the delivery devices comprise respective stamping pins.

17. An apparatus according to claim 1, wherein the first and second delivery devices are operable to transfer the components from the pick-up position to the plurality of receptors on the same bonding region of the electronic device without having to move the electronic device.

* * * * *